US010700210B2

(12) United States Patent
Kikuchi et al.

(10) Patent No.: US 10,700,210 B2
(45) Date of Patent: Jun. 30, 2020

(54) SEMICONDUCTOR DEVICE, AND MANUFACTURING METHOD FOR SAME

(71) Applicant: Sharp Kabushiki Kaisha, Sakai, Osaka (JP)

(72) Inventors: Tetsuo Kikuchi, Sakai (JP); Hajime Imai, Sakai (JP); Hisao Ochi, Sakai (JP); Tetsuo Fujita, Sakai (JP); Hideki Kitagawa, Sakai (JP); Masahiko Suzuki, Sakai (JP); Shingo Kawashima, Sakai (JP); Tohru Daitoh, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/531,385

(22) PCT Filed: Nov. 19, 2015

(86) PCT No.: PCT/JP2015/082500
§ 371 (c)(1),
(2) Date: May 26, 2017

(87) PCT Pub. No.: WO2016/084688
PCT Pub. Date: Jun. 2, 2016

(65) Prior Publication Data
US 2017/0358674 A1 Dec. 14, 2017

(30) Foreign Application Priority Data

Nov. 28, 2014 (JP) .................................. 2014-242538

(51) Int. Cl.
*H01L 29/786* (2006.01)
*H01L 27/12* (2006.01)
(Continued)

(52) U.S. Cl.
CPC .......... *H01L 29/786* (2013.01); *G02F 1/1368* (2013.01); *G02F 1/136277* (2013.01);
(Continued)

(58) Field of Classification Search
None
See application file for complete search history.

(56) References Cited

U.S. PATENT DOCUMENTS

2003/0047785 A1* 3/2003 Kawasaki ........... H01L 29/4908
257/350
2010/0035379 A1* 2/2010 Miyairi ............... H01L 27/1225
438/104
(Continued)

FOREIGN PATENT DOCUMENTS

JP 2001-210826 A 8/2001
JP 2010-062549 A 3/2010
(Continued)

*Primary Examiner* — Jay C Chang
(74) *Attorney, Agent, or Firm* — ScienBiziP, P.C.

(57) ABSTRACT

A semiconductor device includes a substrate and a thin film transistor supported by the substrate. The thin film transistor includes a gate electrode, an oxide semiconductor layer, a gate insulating layer provided between the gate electrode and the oxide semiconductor layer, and source and drain electrodes electrically connected to the oxide semiconductor layer. The gate insulating layer includes a first portion which is covered with the oxide semiconductor layer and a second portion which is adjacent to the first portion and which is not covered with any of the oxide semiconductor layer, the source electrode and the drain electrode. The second portion is smaller in thickness than the first portion, and the difference in thickness between the second portion and the first portion is more than 0 nm and not more than 50 nm.

9 Claims, 8 Drawing Sheets

(51) Int. Cl.
  *H01L 29/66* (2006.01)
  *H01L 29/49* (2006.01)
  *H01L 29/417* (2006.01)
  *H01L 29/423* (2006.01)
  *G02F 1/1368* (2006.01)
  *H01L 21/28* (2006.01)
  *G02F 1/1362* (2006.01)
  *H01L 21/02* (2006.01)
  *G02F 1/1345* (2006.01)
  *G02F 1/1333* (2006.01)

(52) U.S. Cl.
  CPC .. *H01L 21/02323* (2013.01); *H01L 21/02565* (2013.01); *H01L 21/28* (2013.01); *H01L 27/1248* (2013.01); *H01L 29/417* (2013.01); *H01L 29/41733* (2013.01); *H01L 29/42384* (2013.01); *H01L 29/4908* (2013.01); *H01L 29/66969* (2013.01); *H01L 29/7869* (2013.01); *H01L 29/78696* (2013.01); *G02F 1/1345* (2013.01); *G02F 2001/133311* (2013.01)

(56) References Cited

U.S. PATENT DOCUMENTS

| | | | |
|---|---|---|---|
| 2011/0090184 A1 | 4/2011 | Yamazaki et al. | |
| 2011/0210347 A1* | 9/2011 | Takeguchi | H01L 29/66765 257/88 |
| 2012/0138922 A1 | 6/2012 | Yamazaki et al. | |
| 2013/0009219 A1 | 1/2013 | Yamazaki et al. | |
| 2013/0153904 A1* | 6/2013 | Nishimura | G02F 1/133345 257/57 |
| 2013/0181222 A1* | 7/2013 | Liu | H01L 29/78693 257/59 |
| 2013/0320334 A1 | 12/2013 | Yamazaki et al. | |
| 2014/0009706 A1 | 1/2014 | Kim et al. | |
| 2014/0151686 A1* | 6/2014 | Yamazaki | H01L 29/66969 257/43 |
| 2014/0209894 A1* | 7/2014 | Lee | H01L 29/66969 257/43 |
| 2014/0286076 A1 | 9/2014 | Aoki et al. | |
| 2015/0277168 A1 | 10/2015 | Takanishi et al. | |

FOREIGN PATENT DOCUMENTS

| | | |
|---|---|---|
| JP | 2011-103453 A | 5/2011 |
| JP | 2012-134475 A | 7/2012 |
| JP | 2013-038399 A | 2/2013 |
| JP | 2014-007399 A | 1/2014 |
| JP | 2014-209727 A | 11/2014 |
| WO | 2012063614 A1 | 5/2012 |
| WO | 2012132953 A1 | 10/2012 |
| WO | 2014080826 A1 | 5/2014 |

\* cited by examiner (a)

(b)

(a1)

(a2)

(b1)

(b2)

(c1)

(c2)

(d1)

(d2)

(a)

(b)

(c)

(a)

(b)

1 …

SEMICONDUCTOR DEVICE, AND MANUFACTURING METHOD FOR SAME

TECHNICAL FIELD

The present invention relates to a semiconductor device formed using an oxide semiconductor and a manufacturing method thereof.

BACKGROUND ART

An active matrix substrate for use in liquid crystal display devices, or the like, includes a switching element, such as a thin film transistor (hereinafter, "TFT"), in each pixel. Known examples of such a switching element include a TFT in which an oxide semiconductor layer is used as the active layer (hereinafter, referred to as "oxide semiconductor TFT"). Patent Document 1 discloses a liquid crystal display device in which InGaZnO (an oxide including indium, gallium and zinc) is used in the active layer of the TFT.

The oxide semiconductor TFT is capable of operating at a higher speed than the amorphous silicon TFT. The oxide semiconductor film is manufactured through a simpler process than the polycrystalline silicon film and is therefore applicable to devices which require a large area. Thus, the oxide semiconductor TFT is a promising candidate for a high-performance active element which can be manufactured with reduced manufacturing steps and a reduced manufacturing cost.

Since the mobility of the oxide semiconductor is high, it is possible to achieve equal or higher performance even if the size is reduced as compared with amorphous silicon TFTs. Therefore, when an active matrix substrate of a display device is manufactured using the oxide semiconductor TFT, the area occupancy of the TFT in each pixel can be reduced, and the pixel aperture ratio can be improved. Accordingly, bright display can be realized even with a reduced amount of light from the backlight, and low power consumption can be realized.

Since the off-leak characteristic of the oxide semiconductor TFT is excellent, it is possible to utilize an operation mode in which the image rewriting frequency is reduced. For example, in the case of displaying a still image, it is possible to drive the TFT so as to rewrite the image data once every second. Such a driving method is referred to as "intermittent driving" or "low frequency driving" and is capable of greatly reducing the power consumption by the display device.

CITATION LIST

Patent Literature

Patent Document 1: Japanese Laid-Open Patent Publication No. 2012-134475
Patent Document 2: WO 2012/132953
Patent Document 3: WO 2014/080826
Patent Document 4: WO 2012/063614

SUMMARY OF INVENTION

Technical Problem

However, in an oxide semiconductor TFT, when a reductive gas (e.g., hydrogen gas) comes into contact with an oxide semiconductor layer during the manufacturing process or the like, oxygen deficiencies occur so that the characteristics of the TFT disadvantageously vary. It is also known that the TFT characteristics vary due to external moisture, or the like, which enters the oxide semiconductor layer after driving for a long duration or after an aging test. Specifically, when a n-type oxide semiconductor layer undergoes reduction due to entry of moisture, or the like, there is a probability that the threshold voltage Vth shifts to the negative side, so that the off-leak current increases or a depression (normally-on state) occurs, leading to a display failure.

For example, in a channel-etch type oxide semiconductor TFT, the channel region of the oxide semiconductor layer between the source electrode and the drain electrode is covered with a protecting layer (also, referred to as "passivation layer"). However, when a $SiN_x$ film or the like is formed as the protecting layer, hydrogen diffuses into the oxide semiconductor layer in this step so that the characteristics of the TFT disadvantageously vary. Also in the channel-etch type structure TFT, there are many steps at the ends of respective layers, and the coverage by the protecting layer (step coverage) is not sufficient. In some cases, the structure fails to prevent a gas or moisture from reaching the oxide semiconductor layer even after formation of the protecting layer.

In view of the above, various solutions have been suggested for preventing hydrogen or moisture from reaching the oxide semiconductor layer. Patent Document 2 discloses a configuration where a protecting film is provided so as to cover a flattening resin film provided on an oxide semiconductor TFT. In this configuration, a highly-absorbent flattening resin film (organic photosensitive resin or the like) is covered with a dampproof protecting film of $SiN_x$ or the like, whereby entry of moisture into the flattening resin film is suppressed. Patent Document 2 also discloses a configuration where a sealant surrounding a liquid crystal layer and a flattening resin film are arranged so as not to overlap, whereby entry of moisture from the outside of a liquid crystal panel into the flattening resin film is suppressed. This prevents moisture from reaching the oxide semiconductor layer via the flattening resin film.

Patent Document 3 and Patent Document 4 disclose, to stabilize the TFT characteristics, the technique of forming a protecting layer which covers an oxide semiconductor layer such that the protecting layer is realized by two layers of different compositions. Particularly, they disclose realizing the upper layer by a 35-75 nm thick silicon nitride layer. Patent Document 4 discloses covering the entirely of a lower silicon oxynitride layer in the shape of an island, including the lateral faces of the layer, with an upper silicon nitride (or silicon oxynitride) layer.

However, there is a probability that the conventional solutions fail to sufficiently suppress depression of the oxide semiconductor TFT or cannot achieve desirable device characteristics without complicating the manufacturing process and hence incurring an increase of the manufacturing cost.

The present invention was conceived in view of the above-described problems. One of the objects of the present invention is to realize stable TFT characteristics in a semiconductor device which includes an oxide semiconductor TFT.

Solution to Problem

A semiconductor device according to one embodiment of the present invention includes: a substrate; and a thin film transistor supported by the substrate, the thin film transistor including a gate electrode, an oxide semiconductor layer, a gate insulating layer provided between the gate electrode and the oxide semiconductor layer, and source and drain electrodes electrically connected to the oxide semiconductor layer. The gate insulating layer includes a first portion which is covered with the oxide semiconductor layer and a second portion which is adjacent to the first portion and which is not covered with any of the oxide semiconductor layer, the source electrode and the drain electrode. The second portion is smaller in thickness than the first portion, and a difference between the thickness of the second portion and the thickness of the first portion is more than 0 nm and not more than 50 nm.

In one embodiment, the gate insulating layer includes a lower insulating layer which is in contact with the gate electrode and an upper insulating layer which is provided on the lower insulating layer, and a thickness of the upper insulating layer in the second portion is smaller than a thickness of the upper insulating layer in the first portion, and a thickness of the lower insulating layer in the second portion is equal to a thickness of the lower insulating layer in the first portion.

In one embodiment, the gate insulating layer includes a lower insulating layer which is in contact with the gate electrode and an upper insulating layer provided on the lower insulating layer, and the upper insulating layer is provided in the first portion but not provided in the second portion.

In one embodiment, the upper insulating layer is a silicon oxide layer, and the lower insulating layer is a silicon nitride layer.

In one embodiment, in the first portion of the gate insulating layer which is covered with the oxide semiconductor layer, the thickness of the upper insulating layer is not less than 25 nm and not more than 450 nm, and the thickness of the lower insulating layer is not less than 25 nm and not more than 500 nm.

In one embodiment, the semiconductor device further includes a protecting layer covering the oxide semiconductor layer and the source and drain electrodes. The protecting layer includes a lower protecting layer which is in contact with an upper surface of the oxide semiconductor layer and an upper protecting layer which is provided on the lower protecting layer. The lower protecting layer is a silicon oxide layer, and the upper protecting layer is a silicon nitride layer.

In one embodiment, a thickness of the upper protecting layer is not less than 25 nm and not more than 150 nm.

In one embodiment, the source and drain electrodes include a lower layer electrode which is in contact with the oxide semiconductor layer and an upper layer electrode provided on the lower layer electrode, the lower layer electrode contains Ti or Mo, and the upper layer electrode contains at least one metal element among Cu, Al and Mo.

In one embodiment, the oxide semiconductor layer contains an In—Ga—Zn—O based semiconductor.

In one embodiment, the oxide semiconductor layer includes a crystalline portion.

In one embodiment, the thin film transistor has a channel etch structure.

A method for manufacturing a semiconductor device according to one embodiment of the present invention includes: providing a substrate; forming a gate electrode on the substrate; forming a gate insulating layer so as to cover the gate electrode; providing an oxide semiconductor layer on the gate insulating layer so as to at least partially extend over the gate electrode; and forming source and drain electrodes on the oxide semiconductor layer such that the source and drain electrodes are spaced away from each other and each connected with the oxide semiconductor layer, wherein the step of forming the source and drain electrodes includes depositing a lower layer electrode film which contains Ti or Mo, depositing an upper layer electrode film on the lower layer electrode film, the upper layer electrode film containing at least one metal element among Cu, Al and Mo, providing a resist on the upper layer electrode film and patterning the upper layer electrode film by wet etching, after the patterning of the upper layer electrode film, patterning the lower layer electrode film using the resist by dry etching, and dry etching an upper surface of the gate insulating layer exposed by the patterning of the lower layer electrode film to a depth of more than 0 nm and not more than 50 nm.

Advantageous Effects of Invention

According to one embodiment of the present invention, a semiconductor device is provided which is capable of realizing desirable oxide semiconductor TFT characteristics while achieving reduction in resistance of wires.

DESCRIPTION OF EMBODIMENTS

Hereinafter, a semiconductor device of an embodiment of the present invention is described with reference to the drawings. The semiconductor device of the present embodiment includes an oxide semiconductor TFT. Note that the semiconductor device of the present embodiment only needs to include an oxide semiconductor TFT and includes a wide variety of applications, such as active matrix substrates, various display devices, electronic devices, etc.

Embodiment 1

Figure 1:
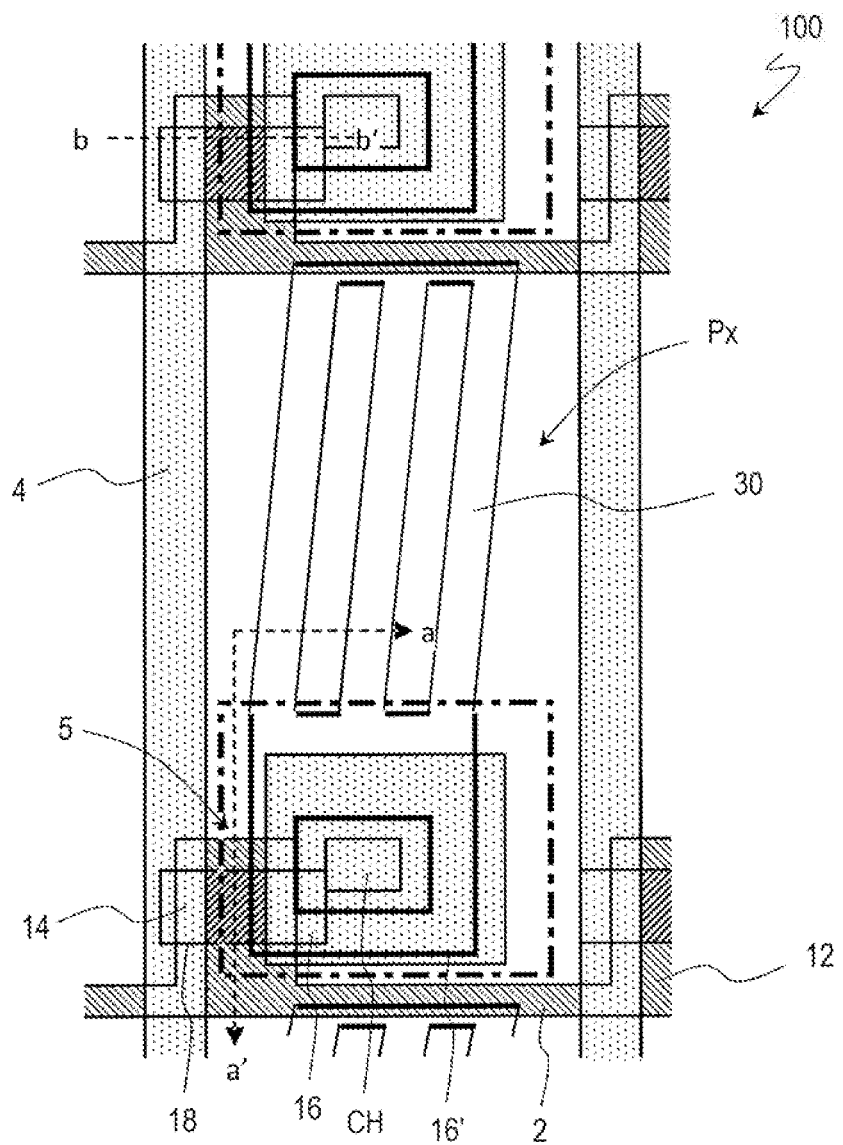
FIG. 1 A schematic plan view of a semiconductor device (active matrix substrate) of Embodiment 1.

FIG. 1 is a schematic plan view of a region corresponding to one pixel of an active matrix substrate (semiconductor device) 100 for use in a liquid crystal display device. FIGS. 2(a) and 2(b) are cross-sectional views taken along line a-a' and line b-b' of FIG. 1.

As shown in FIG. 1 and FIGS. 2(a) and 2(b), an active matrix substrate 100 includes an oxide semiconductor TFT 5 provided on a substrate 10, a protecting layer 22 covering the oxide semiconductor TFT 5, a flattening layer 24 covering the protecting layer 22, and a pixel electrode 30 provided over the flattening layer 24 and electrically connected to the oxide semiconductor TFT 5. The oxide semiconductor TFT 5 is driven by a scan line 2 extending in a horizontal direction and a signal line 4 extending in a vertical direction as shown in FIG. 1. In the present embodiment, a region surrounded by the scan lines 2 and the signal lines 4 corresponds to one pixel Px. Note that, although FIG. 1 shows only one pixel Px, the active matrix substrate 100 includes a plurality of pixels Px that are arranged in a matrix along a horizontal direction and a vertical direction.

The active matrix substrate 100 of the present embodiment is used in a liquid crystal display device which operates in a FFS (Fringe Field Switching) mode. As shown in FIGS. 2(a) and 2(b), in the active matrix substrate 100, the common electrode 32 is provided on the flattening layer 24. The common electrode 32 is covered with an interlayer insulating layer (inorganic insulating layer) 26. The pixel electrode 30 is provided on the interlayer insulating layer 26 so as to oppose the common electrode 32.

The pixel electrode 30 includes a plurality of linear portions (or a plurality of slits) and is connected with the oxide semiconductor TFT 5 at the bottom of a contact hole CH that is formed so as to penetrate through the interlayer insulating layer 26, the flattening layer 24 and the protecting layer 22. Meanwhile, the common electrode 32 has an opening extending to an outer region of the contact hole CH. The common electrode 32 is insulated from the pixel electrode 30 by the interlayer insulating layer 26. In this configuration, a fringe electric field can be produced between the pixel electrode 30 and the common electrode 32.

The oxide semiconductor TFT 5 includes a gate electrode 12 provided on the substrate 10, a gate insulating layer 20 covering the gate electrode 12, an oxide semiconductor layer 18 which is typically in the shape of an island and arranged so as to extend over the gate electrode 12 with the gate insulating layer 20 interposed therebetween, and a source electrode 14 and a drain electrode 16 which are connected with the oxide semiconductor layer 18. The source electrode 14 and the drain electrode 16 are provided on the oxide semiconductor layer 18 so as to be spaced away from each other and to oppose each other. Thus, the oxide semiconductor TFT 5 is a channel etch type (back channel etch (BCE)) TFT.

As illustrated, in a "channel etch type TFT", an etch stop layer is not provided on the channel region, and the channel side edges of the source and drain electrodes are arranged so as to be in contact with the upper surface of the oxide semiconductor layer. The channel etch type TFT is formed by, for example, forming an electrically-conductive film for source and drain electrodes on the oxide semiconductor layer and performing source-drain separation. In the source-drain separation step, a surface portion of the channel region is etched in some cases.

The gate electrode 12 is connected with the scan line 12. The source electrode 14 is connected with the signal line 4. As shown in FIG. 1, in the present embodiment, part of the signal line 4 that is extending in a vertical direction forms the source electrode 14. Note that, however, the present invention is not limited to this example. The source electrode 14 may be provided so as to extend in a horizontal direction from the signal line 4.

In the present embodiment, the source electrode 14 and the drain electrode 16 respectively include an upper layer source electrode 14a and an upper layer drain electrode 16a which contain Cu, and a lower layer source electrode 14b and a lower layer drain electrode 16b which are in contact with the oxide semiconductor layer 18. Hereinafter, the upper layer source electrode 14a and the upper layer drain electrode 16a are generically referred to as "upper layer electrodes", and the lower layer source electrode 14b and the lower layer drain electrode 16b are generically referred to as "lower layer electrodes". The source and drain electrodes 14, 16 are also generically referred to as "SD electrodes".

The upper layer electrodes may contain at least one metal element among Cu, Al and Mo. The upper layer electrodes may be a layer which contains Cu as a major constituent and may be a Cu layer which does not substantially contain impurities (a layer which is made of Cu with the purity of not less than 99.99 at %), a Cu layer which contains impurities (e.g., a layer which contains Cu in a proportion of not less than 90 at %), or a Cu alloy layer (e.g., CuCa based alloy layer). By forming the upper electrodes whose major constituent is Cu that has high electrical conductivity, the resistance can be reduced. Therefore, when the active matrix substrate 100 is used in a display device, deterioration of the display quality which is attributed to delay or deformation of the data signal can be suppressed. Note that the upper layer electrodes may be a layer whose major constituent is Al (e.g., Al layer) or a layer whose major constituent is Mo (e.g., Mo layer).

Meanwhile, the lower layer electrodes may be made of, for example, Ti or Mo. By thus providing the lower layer electrodes, the contact resistance between the oxide semiconductor layer 18 and the SD electrodes can be reduced.

Note that, however, the present invention is not limited to the above-described examples. The upper and lower electrodes may have various configurations. For example, although the two-layer electrode configuration where the upper electrode/the lower electrode are Cu/Ti has been illustrated in the foregoing, the electrode may have a three-layer configuration of Ti/Al/Ti from top to bottom. Other configuration examples of the source electrode 14 and the drain electrode 16 include Cu/Mo, Cu/Mo alloy, Cu alloy/Cu/Ti, Mo/Cu/Ti, Mo alloy/Cu/Ti, Al/Ti, Mo/Al/Mo, Mo/Al/Ti, etc. The above-described Cu alloy may be, for example, a CuCa based alloy, a CuMgAl based alloy or a CuMn based alloy. The above-described Mo alloy may be, for example, a MoNiNb based alloy. The electrode layer of the lowermost layer which is in contact with the oxide semiconductor layer 18 may contain TiN, a Ti oxide, or the like.

The gate electrode 12 may have a Cu/Ti multilayer structure as the SD electrodes do. When a SD layer (a layer including the signal line 4, the source electrode 14 and the drain electrode 16) and a gate layer (a layer including the scan line 2 and the gate electrode 12) have the same structures, the manufacturing process can advantageously be simplified.

The oxide semiconductor contained in the oxide semiconductor layer 18 may be an amorphous oxide semiconductor or may be a crystalline oxide semiconductor which includes a crystalline portion. Examples of the crystalline oxide semiconductor include a polycrystalline oxide semiconductor and a microcrystalline oxide semiconductor. Alternatively, the crystalline oxide semiconductor may be a crystalline oxide semiconductor in which the c-axis is oriented generally perpendicular to the layer surface.

The oxide semiconductor layer 18 may have a multilayer structure consisting of two or more layers. When the oxide semiconductor layer 18 has a multilayer structure, the oxide semiconductor layer 18 may include a non-crystalline oxide semiconductor layer and a crystalline oxide semiconductor layer. Alternatively, the oxide semiconductor layer 18 may include a plurality of crystalline oxide semiconductor layers which have different crystalline structures. When the oxide semiconductor layer 18 has a two-layer structure including the upper layer and the lower layer, it is preferred that the energy gap of the oxide semiconductor contained in the upper layer is greater than the energy gap of the oxide semiconductor contained in the lower layer. Note that, however, when the energy gap difference between these layers is relatively small, the energy gap of the oxide semiconductor of the lower layer may be greater than the energy gap of the oxide semiconductor of the upper layer.

The materials, structures and film formation methods of the non-crystalline oxide semiconductor and the respective aforementioned crystalline oxide semiconductors, and the configuration of the oxide semiconductor layer which has a multilayer structure, are disclosed in, for example, Japanese Laid-Open Patent Publication No. 2014-007399. The entire disclosure of Japanese Laid-Open Patent Publication No. 2014-007399 is incorporated by reference in this specification.

The oxide semiconductor layer 18 may contain, for example, at least one metal element among In, Ga and Zn. In the present embodiment, the oxide semiconductor layer 18 contains, for example, an In—Ga—Zn—O based semiconductor. Here, the In—Ga—Zn—O based semiconductor is a ternary oxide including In (indium), Ga (gallium) and Zn (zinc). The proportion (composition ratio) of In, Ga and Zn is not particularly limited but includes, for example, In:Ga:Zn=2:2:1, In:Ga:Zn=1:1:1, and In:Ga:Zn=1:1:2. The oxide semiconductor layer 18 which has such a composition can be formed by an oxide semiconductor film which contains an In—Ga—Zn—O based semiconductor. Note that a channel etch type TFT which has an active layer containing an In—Ga—Zn—O based semiconductor is also referred to as "CE-InGaZnO-TFT".

The In—Ga—Zn—O based semiconductor may be amorphous or may be crystalline. As the crystalline In—Ga—Zn—O based semiconductor, a crystalline In—Ga—Zn—O based semiconductor in which the c-axis is oriented generally perpendicular to the layer surface is preferred.

The crystalline structure of the crystalline In—Ga—Zn—O based semiconductor is disclosed in, for example, aforementioned Japanese Laid-Open Patent Publication No. 2014-007399, Japanese Laid-Open Patent Publication No. 2012-134475, and Japanese Laid-Open Patent Publication No. 2014-209727. The entire disclosures of Japanese Laid-Open Patent Publication No. 2012-134475 and Japanese Laid-Open Patent Publication No. 2014-209727 are incorporated by reference in this specification. A TFT which includes an In—Ga—Zn—O based semiconductor layer has high mobility (20 times or more as compared with an a-Si TFT) and low current leakage (less than 1/100 as compared with an a-Si TFT), and is therefore suitably used as a driver TFT and a pixel TFT.

The oxide semiconductor layer 18 may contain a different oxide semiconductor instead of the In—Ga—Zn—O based semiconductor. For example, the oxide semiconductor layer 18 may contain an In—Sn—Zn—O based semiconductor (e.g., $In_2O_3$—$SnO_2$—ZnO). In—Sn—Zn—O based semiconductor is a ternary oxide including In (indium), Sn (tin) and Zn (zinc). Alternatively, the oxide semiconductor layer 18 may contain an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, or the like.

In the active matrix substrate 100 of the present embodiment, the gate insulating layer 20 has a multilayer structure which includes a lower insulating layer 20b and an upper insulating layer 20a provided on the lower insulating layer 20b. The lower surface of the lower insulating layer 20b is in contact with the substrate 10 and the gate electrode 12. Meanwhile, the upper surface of the upper insulating layer 20a is in contact with the oxide semiconductor layer 18 and the SD electrodes.

The lower insulating layer 20b may be made of, for example, $SiN_x$ or $SiN_xO_y$ (x>y). The upper insulating layer 20a may be made of, for example, $SiO_2$ or $SiO_xN_y$ (x>y). When a layer which contains oxygen (e.g., an oxide layer such as $SiO_2$) is used as the upper insulating layer 20a that is in contact with the oxide semiconductor layer 18, oxygen deficiencies in the oxide semiconductor layer can be covered by oxygen contained in the oxide layer.

Figure 9:
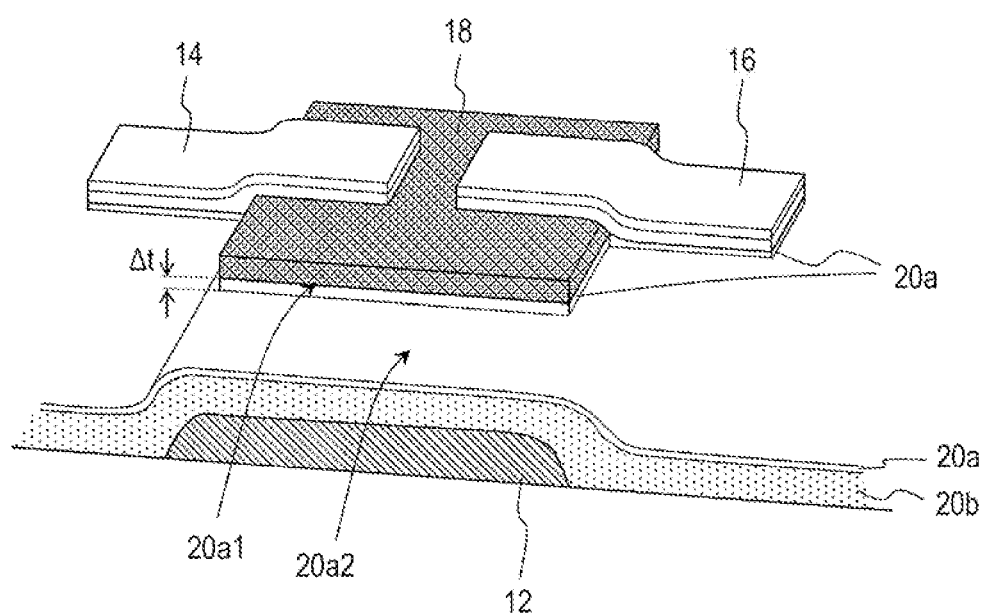
FIG. 9 (a) is a perspective view showing one aspect of the manufacturing process of a semiconductor device of the present embodiment. (b) is a perspective view showing one aspect of the manufacturing process of a semiconductor device of the comparative example.
Figure 9:
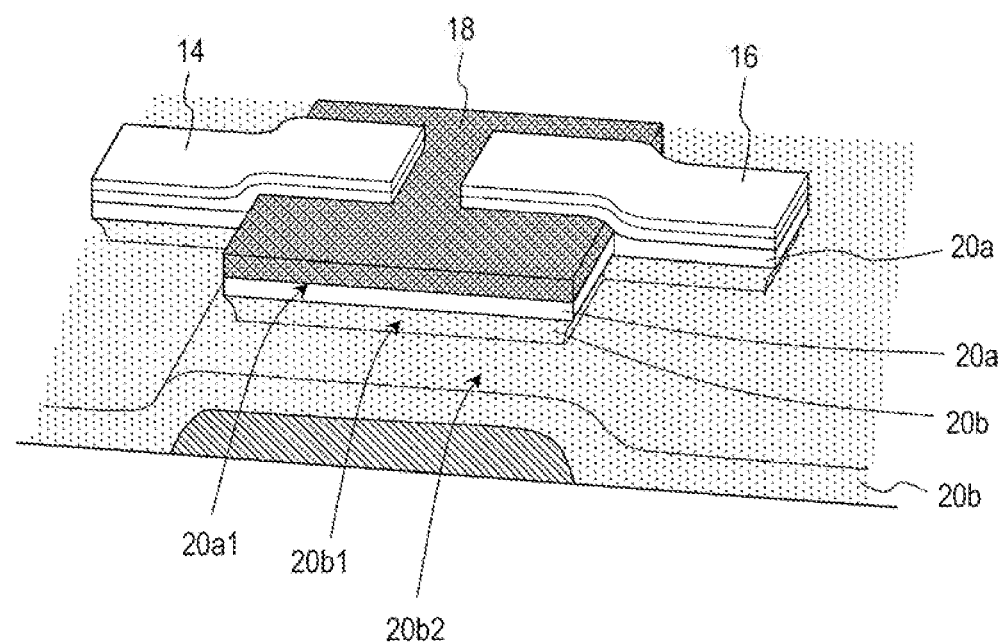

Here, as shown in FIG. 2(a), the upper insulating layer 20a includes a first portion 20a1 which is covered with the oxide semiconductor layer 18 and a second portion 20a2 which is adjacent to the first portion 20a1 and which is not covered with the oxide semiconductor layer 18. The first portion 20a1 is greater in thickness than the second portion 20a2. The reason why the first portion 20a1 and the second portion 20a2 thus have different thicknesses is that, as will be described later, as etching of an electrically-conductive film advances for patterning in the step of forming the source electrode 14 and the drain electrode 16 (hereinafter, also referred to as "SD electrode formation step"), the underlying gate insulating layer 20 is partially exposed and, in such a part, the surface of the gate insulating layer 20 is also etched (overetched). More specifically, as shown in FIG. 9(a), in the aforementioned SD electrode formation step, part or the entirety of the second portion 20a2 that is not covered with the oxide semiconductor layer 18 (or the resist for formation of the source electrode 14 and the drain electrode 16) is selectively etched, while the first portion 20a1 that is covered with the oxide semiconductor layer 18 is not etched. As a result, the second portion 20a2 is smaller in thickness than the first portion 20a1.

In the upper insulating layer 20a, the difference in thickness between the first portion 20a1 and the second portion 20a2, Δt (see FIG. 2(a) and FIG. 9(a): hereinafter, also referred to as "step height Δt"), is set within a range of more than 0 nm and not more than 50 nm. This step height Δt corresponds to an etching amount for a part of the exposed second portion 20a2 etched away in the SD electrode formation step.

Although FIG. 2(a) shows an example where the second portion 20a2 of the upper insulating layer 20a which has a reduced thickness is remaining, the present invention is not limited to this example. The present invention includes an alternative example where the upper insulating layer 20a is selectively formed in the first portion 20a1 (i.e., a portion covered with either of the oxide semiconductor layer 18, the source electrode 14 or the drain electrode 16) while the upper insulating layer 20a is not provided in the outside of the first portion 20a1, so that the lower insulating layer 20b is exposed. This corresponds to an example where the upper insulating layer 20a in the second portion 20a2 is thoroughly etched away in the aforementioned SD electrode formation step.

Although the upper insulating layer 20a includes the first portion 20a1 and the second portion 20a2 that have different thicknesses, the thickness of the lower insulating layer 20b may be generally uniform across the entire surface. The thickness of the upper insulating layer 20a in the first portion 20a1 may be not less than 25 nm and not more than 450 nm. The thickness of the lower insulating layer 20b may be not less than 25 nm and not more than 500 nm. These thicknesses mean the thicknesses of the upper insulating layer 20a and the lower insulating layer 20b before the SD electrode formation step is performed.

When in the gate insulating layer 20 the step formed at the border between the first portion 20a1 and the second portion 20a2, $\Delta t$, is relatively small, e.g., more than 0 nm and not more than 50 nm, the lateral surface of the step $\Delta t$ is formed at an angle relatively close to the vertical but at least is not inclined such that the lower part is recessed inward (the lateral surface is not reversely tapered). This configuration improves the coverage of the protecting layer 22 overlying the gate insulating layer 20.

When the above-described step height $\Delta t$ exceeds 50 nm, for example, side etching of the lower insulating layer 20b advances so that the lateral surface of the lower insulating layer 20b can recede inside the outline of the oxide semiconductor layer 18. In this case, there is a probability that a gap is made when the protecting layer 22 is provided, and the coverage decreases, so that hydrogen and moisture are likely to reach the oxide semiconductor layer 18. On the other hand, when the step height $\Delta t$ is excessively small, separation of the source and drain electrodes is not sufficiently completed, and there is a probability that a residue of the electrically-conductive layer occurs on the channel region of the oxide semiconductor layer 18. Thus, setting the step height $\Delta t$ to a certain largeness is preferred for achieving appropriate TFT characteristics. From this viewpoint, the step height $\Delta t$ is preferably not less than 5 nm, more preferably not less than 15 nm.

In the active matrix substrate 100 of the present embodiment, the protecting layer 22 includes a lower protecting layer 22b and an upper protecting layer 22a. The lower protecting layer 22b may be made of, for example, $SiO_2$ or $SiO_xN_y$ (x>y). The upper protecting layer 22a may be made of, for example, $SiN_x$ or $SiN_xO_y$ (x>y).

When the largeness of the step height $\Delta t$ of the gate insulating layer 20 is within an appropriate range as described above, the source electrode 14 and the drain electrode 16 are appropriately separated, and a sufficient coverage of the protecting layer 22 can be ensured without leaving an electrically-conductive material as a residue between these electrodes. Thus, the characteristics of the oxide semiconductor TFT 5 can be stable.

Hereinafter, a manufacturing process of the active matrix substrate 100A is described with reference to FIG. 3 and other relevant drawings.

Figure 3:
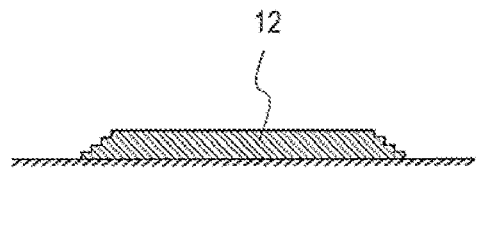
FIG. 3 Diagrams for illustrating the manufacturing steps of the semiconductor device of Embodiment 1. (a1) to (d1) are cross-sectional views illustrating different steps. (a2) to (d2) are plan views corresponding to (a1) to (d1), respectively.
Figure 3:
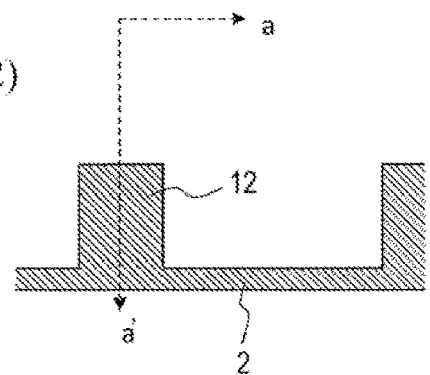
Figure 3:
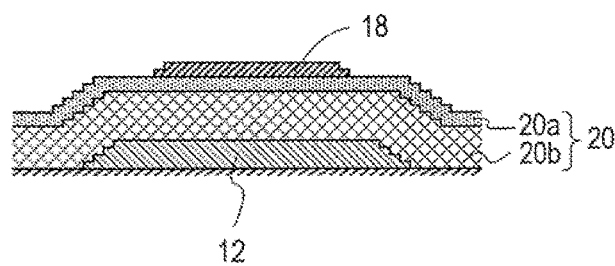
Figure 3:
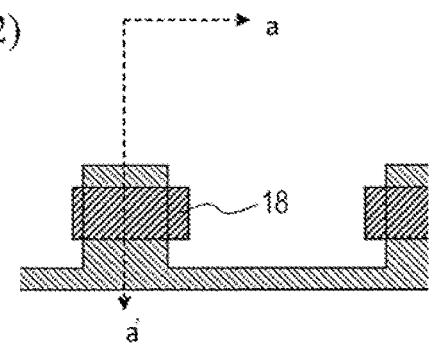
Figure 3:
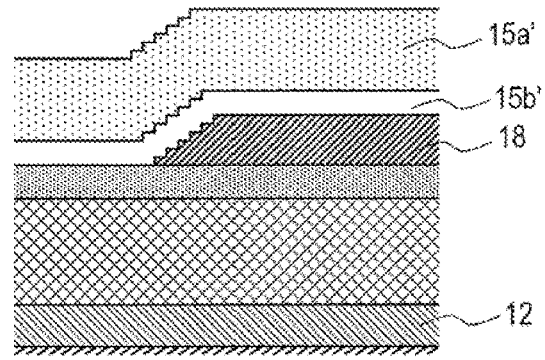
Figure 3:
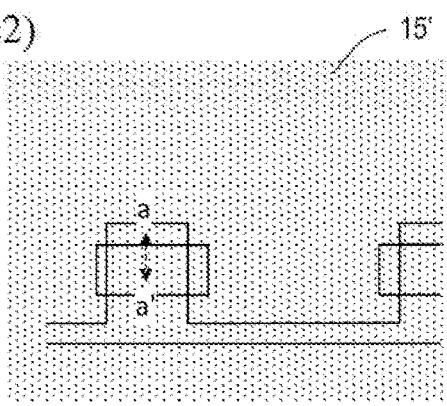
Figure 3:
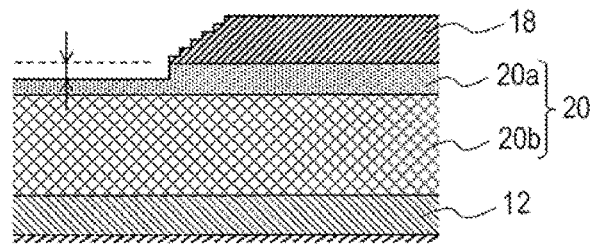
Figure 3:
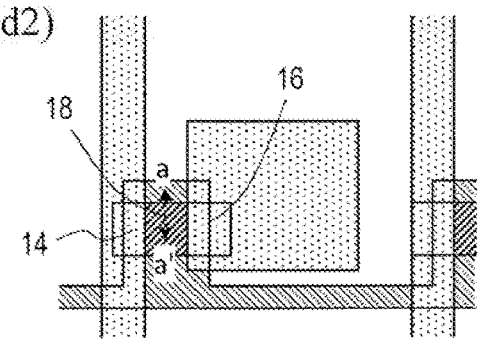

Firstly, as shown in FIGS. 3(a1) and 3(a2), a gate layer including a gate electrode 12 and a scan line 2 is formed on a substrate 10. As the substrate 10, for example, a glass substrate, a silicon substrate, a heat-resistant plastic substrate (resin substrate), or the like, can be used.

FIG. 3(a1) shows a cross section taken along line a-a' of FIG. 3(a2). The same applies to FIGS. 3(b1) to 3(d1) and 3(b2) to 3(d2) in the following sections.

The gate electrode 12 and the scan line 2 are realized by, for example, forming a metal film (thickness: e.g., not less than 50 nm and not more than 500 nm) on a glass substrate 10 by sputtering and patterning the formed metal film. The patterning is realized by photolithography and wet etching.

In the present embodiment, the metal film is realized by a Cu/Ti film which is produced by forming a Ti film (thickness: 5-100 nm) and a Cu film (thickness: 100-500 nm) in this order. Note that, however, the material of the metal film is not particularly limited. A film which includes a metal, such as aluminum (Al), tungsten (W), molybdenum (Mo), tantalum (Ta), chromium (Cr), titanium (Ti), copper (Cu), or the like, or an alloy thereof, or a metal nitride thereof, can be appropriately used.

Next, as shown in FIGS. 3(b1) and 3(b2), a gate insulating layer 20 is formed so as to cover the gate electrode 12 and the scan line 2, and thereafter, an oxide semiconductor layer 18 is formed typically in the shape of an island so as to at least partially extend over the gate electrode 12 with the gate insulating layer 20 interposed therebetween.

To obtain the gate insulating layer 20, firstly, a $SiN_x$ film having a thickness of, for example, 25-500 nm is formed for preventing diffusion of impurities from the substrate 10, and a $SiO_2$ film having a thickness of, for example, 25-450 nm is formed on the $SiN_x$ film. Thereby, a gate insulating layer 20 is obtained which includes the lower insulating layer 20b of $SiN_x$ and the upper insulating layer 20a of $SiO_2$.

The oxide semiconductor layer 18 is realized by forming an oxide semiconductor film (having a thickness of, for example, not less than 30 nm and not more than 200 nm) by sputtering and patterning the formed oxide semiconductor film. By using different target materials in the sputtering, a multilayer oxide semiconductor film may be formed in which the layers have different compositions. In the multilayer oxide semiconductor film, the composition may be adjusted such that the gallium atomic fraction in the upper layer is greater than the gallium atomic fraction in the lower layer. In the patterning performed after the oxide semiconductor film is provided, a resist is provided by utilizing photolithography, and a region which is not covered with the resist is etched by wet etching. Thereafter, the resist peeling step and the washing step are performed.

Thereafter, as shown in FIGS. 3(c1) and 3(c2), a metal film 15' is deposited for formation of a SD layer which includes an upper layer electrode and a lower layer electrode.

In this step, firstly, a Ti film (lower layer metal film 15b') is formed by sputtering to a thickness of 5-100 nm, and then, a Cu film (upper layer metal film 15a') is formed to a thickness of 100-500 nm. Then, a resist is provided on the formed Cu/Ti films by photolithography.

Firstly, the Cu film 15a' on the upper side is subjected to, for example, wet etching with the resist being provided thereon, whereby the upper layer electrode is formed. The etching solution used can be, for example, an etchant which contains hydrogen peroxide $H_2O_2$. Here, since the wet etching is isotropic etching, part of the Cu film covered with the resist may also be etched (side-etched).

Then, the Ti film 15b' of the lower layer is, for example, dry-etched to form the lower layer electrode. As shown in FIG. 3(d2), the resultant source electrode 14 and drain electrode 16 are separated from each other above the oxide semiconductor layer 18.

Here, as shown in FIG. 3(d1), in the present embodiment, in etching of the lower layer electrode, the upper insulating layer 20a underlying the lower layer electrode is also partially etched. More specifically, the upper insulating layer 20a is etched to a depth of more than 0 nm and not more than 50 nm. The etching of the upper insulating layer 20a is realized by elongating the etching duration of the lower layer electrode.

Here, as shown in FIG. 9(a), in the etching step in SD electrode formation, etching selectively advances in the second portion 20a2 that is not covered with the resist that covers the oxide semiconductor layer 18 and the source electrode 14 and the drain electrode 16. Meanwhile, etching does not advance in the first portion 20a1 that is covered with the resist that covers the oxide semiconductor layer 18 and the source electrode 14 and the drain electrode 16. As a result, the thickness of the upper insulating layer 20a differs between the first portion 20a1 and the second portion 20a2 (difference Δt).

This etching may be carried out till the upper insulating layer 20a of the second portion 20a2 is thoroughly removed and the lower insulating layer 20b is exposed. Note that, however, in the present embodiment, the etching is not carried out after the lower insulating layer 20b is exposed. This is because, when the lower insulating layer 20b is etched, there is a probability that the lateral surface of the lower insulating layer 20b is reversely tapered at the border between the first portion 20b1 and the second portion 20b2 of the lower insulating layer 20b as shown in FIG. 9(b).

When at the border between the first portion 20b1 and the second portion 20b2 (the periphery of the oxide semiconductor layer 18) the gate insulating layer 20 thus has a portion dug into the extent of the oxide semiconductor layer 18, the coverage decreases and there is a probability that a gap occurs even if the protecting layer 22 is formed so as to cover these.

Figure 4:
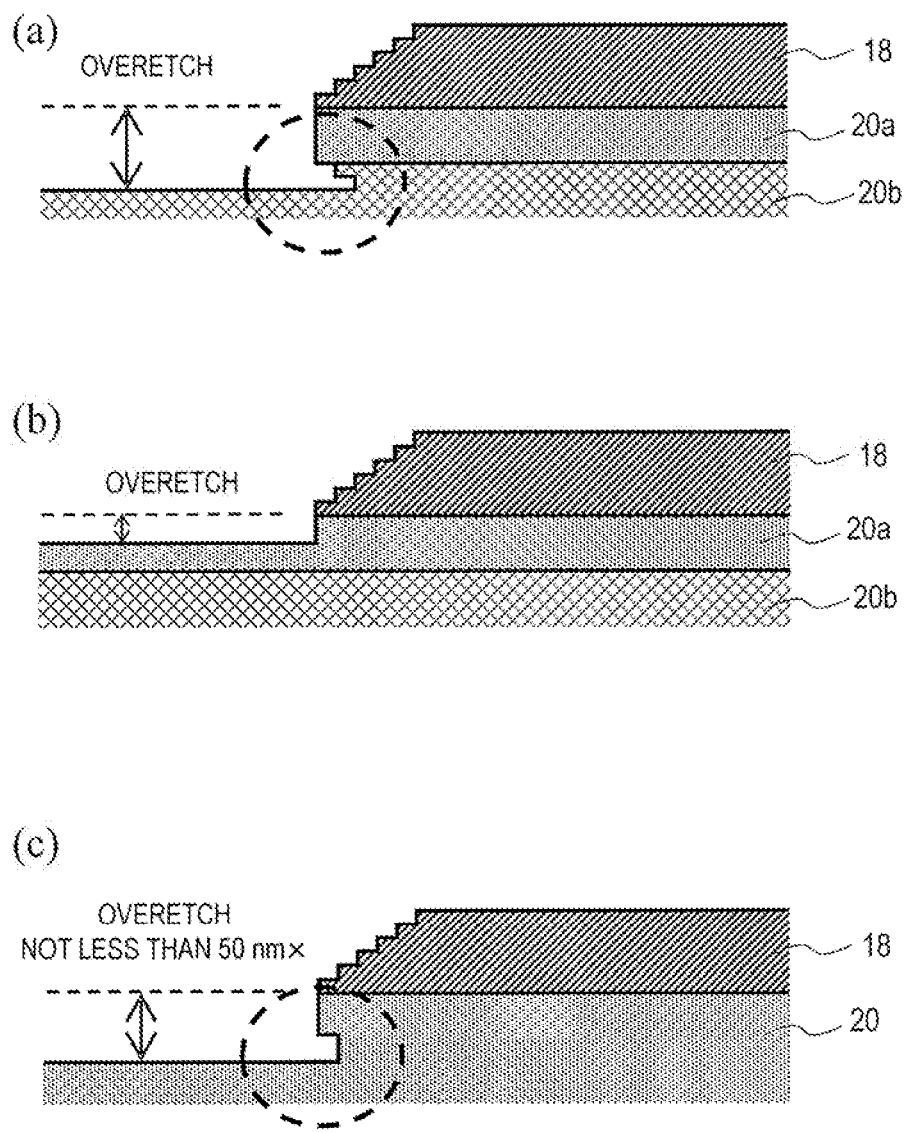
FIGS. 4 (a) and (c) are cross-sectional views illustrating manufacturing steps in a comparative example. (b) is a cross-sectional view illustrating a manufacturing step in Embodiment 1.

FIG. 4(a) is a cross-sectional view showing a comparative example (corresponding to FIG. 9(b)) where etching advances to the lower insulating layer 20b of the gate insulating layer 20 in the etching step of the SD layer (Cu/Ti layers). Particularly when the upper insulating layer 20a is made of $SiO_2$ and the lower insulating layer 20b is made of $SiN_x$, etching of the lower insulating layer 20b advances faster because the etching rates meet $SiN_x>SiO_2$, and there is a probability that the etching advances such that a portion under $SiO_2$ is dug away, resulting in a reversely-tapered lateral surface. To prevent such a situation, it is preferred that the overetch amount (step difference Δx) is controlled to be not more than the thickness of the upper insulating layer 20a as in the present embodiment shown in FIG. 4(b).

As shown in FIG. 4(c) as a comparative example, the thickness of the upper insulating layer 20a that is made of $SiO_2$ is relatively large, e.g., about 100 nm, or the gate insulating layer 20 is realized by a single layer of $SiO_2$ (e.g., 200 nm thick). Note that, however, even in such a case, when the overetch amount exceeds 50 nm, there is a probability that a reversely-tapered lateral surface is disadvantageously formed at the border. In view of such, in the present embodiment, the overetch amount of the gate insulating layer 20 is not more than the thickness of the upper insulating layer 20a, and the overetch amount (step height Δt) is not more than 50 nm, such that the coverage of the protecting layer 22 is improved.

Figure 5:
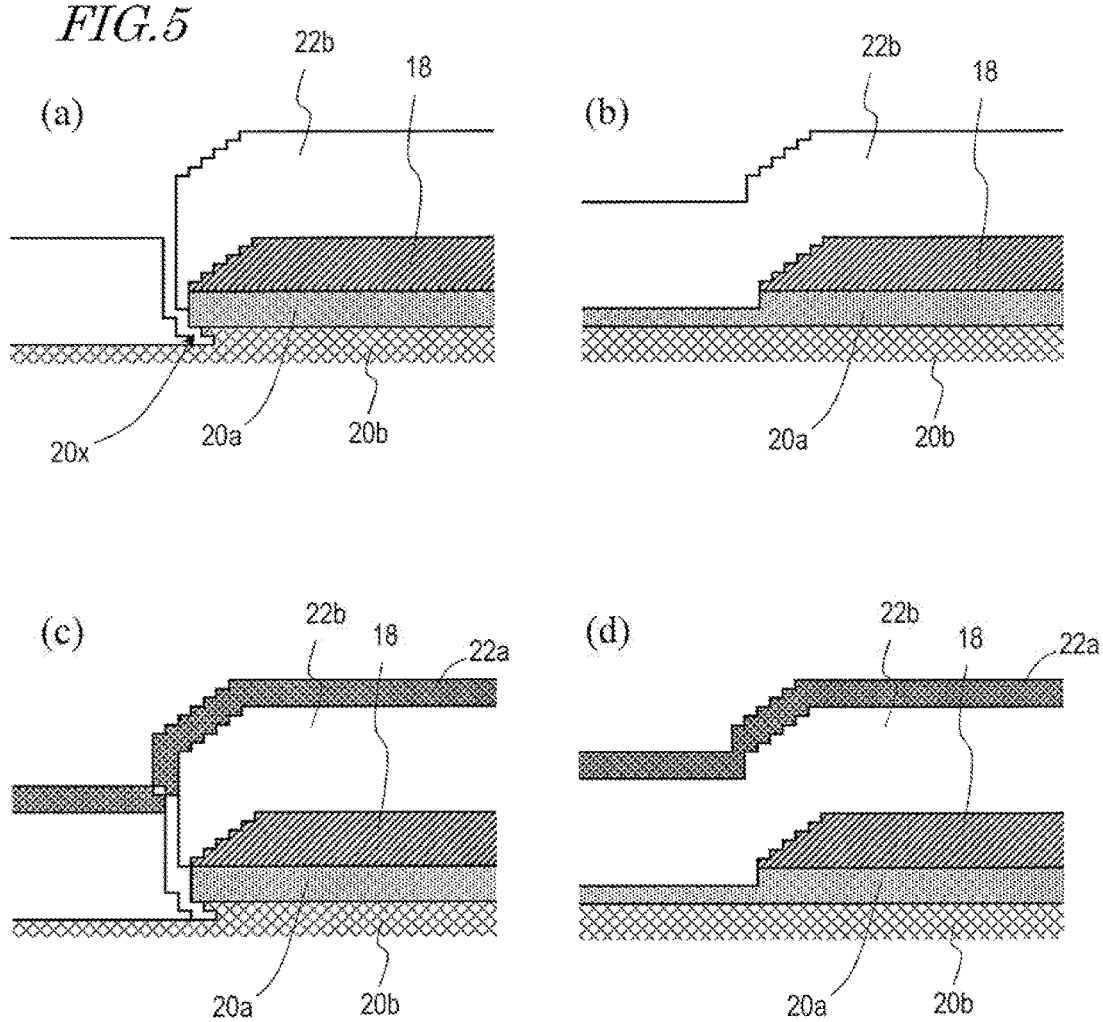
FIGS. 5 (a) and (c) are cross-sectional views illustrating manufacturing steps in the comparative example. (b) and (d) are cross-sectional views illustrating a manufacturing step in Embodiment 1.

FIGS. 5(a) and 5(c) show a structure where the lower protecting layer 22b and the upper protecting layer 22a are provided when the etching has advanced to the lower insulating layer 20b as in the comparative example shown in FIG. 4(a). FIGS. 5(b) and 5(d) show a structure where the lower protecting layer 22b and the upper protecting layer 22a are provided when the etching has advanced to the middle of the upper insulating layer 20a as in the present embodiment shown in FIG. 4(b).

If there is a gap 20x at the border between the upper insulating layer 20a and the lower insulating layer 20b (the peripheral portion of the oxide semiconductor layer 18) as shown in FIG. 5(a), there is a probability that a $SiO_2$ film formed as the lower protecting layer 22b over the gap also has a gap. Further, as shown in FIG. 5(c), there is a probability that a $SiN_x$ film formed thereafter as the upper protecting layer 22a also has a gap. In this case, the coverage of the protecting layer 22 is low and, therefore, there is a probability that moisture enters the oxide semiconductor layer 18 via the flattening layer 24 in an aging test so that depression of the TFT 5 occurs. Also, there is a probability that hydrogen produced in the step of forming the upper protecting layer 22a ($SiN_x$ film) reaches the oxide semiconductor layer 18 to cause depression of the TFT 5. Note that although a gap communicating with the gap 20x can be covered by increasing the thickness of the upper protecting layer 22a, the amount of hydrogen eliminated from the upper protecting layer 22a disadvantageously increases. Thus, excessively increasing the thickness of the upper protecting layer 22a is not preferred. The thickness of the upper protecting layer 22a may be, for example, not less than 25 nm and not more than 150 nm, more preferably not more than 75 nm.

On the other hand, as in the present embodiment shown in FIGS. 5(b) and 5(d), when the etching has advanced to the middle of the upper insulating layer 20a but has not reached the lower insulating layer 20b, the coverage of the lower protecting layer 22b and the upper protecting layer 22a that are provided over the upper insulating layer 20a and the lower insulating layer 20b is excellent. Therefore, moisture is prevented from reaching the oxide semiconductor layer 18 via the flattening layer 24, and variation of the TFT characteristics can be suppressed. Also when the upper protecting layer 22a is realized by a $SiN_x$ film, the upper protecting layer 22a may have an appropriate thickness in the range of not less than 25 nm and not more than 75 nm as previously described. Depression of the TFT 5 can be prevented from occurring due to entry into the oxide semiconductor layer 18 of hydrogen produced in the step of forming the upper protecting layer 22a.

The protecting layer 22 is not limited to the above-described example but may be obtained by, for example, forming a $SiO_2$ film as the lower protecting layer 22b to a thickness of 100-400 nm by CVD and then forming a $SiN_x$ film, a $SiO_xN_y$ film or $SiN_xO_y$ as the upper protecting layer 22a to a thickness of 20-200 nm (preferably 35-75 nm) by CVD.

After the source electrode 14 and the drain electrode 16 are formed as shown in FIGS. 3(d1) and 3(d2) and before the protecting layer 22 is provided, a plasma treatment may be performed using a gas which contains oxygen. Thereby, the oxygen content in the oxide semiconductor layer 18 that is exposed between the source and drain electrodes 14, 16 can be increased. More specifically, for example, a $N_2O$ plasma treatment may be performed under the following conditions: $N_2O$ gas flow rate 3000 sccm; Pressure 100 Pa; Plasma power density 1 W/cm$^2$; Treatment duration 200-300 sec; Substrate temperature 200° C. The oxidation treatment is not limited to a plasma treatment with the use of a $N_2O$ gas. For example, the oxidation treatment can be realized by a plasma treatment with the use of an $O_2$ gas, an ozone treatment, or the like. To perform the treatment without increasing the number of steps, the treatment is desirably performed immediately before the formation step of the protecting layer 22 which will be described later. Specifically, when the protecting layer 22 is formed by CVD, a $N_2O$ plasma treatment can be performed. When the protecting layer 22 is formed by sputtering, an $O_2$ plasma treatment can be performed. Alternatively, the oxidation treatment may be realized by an $O_2$ plasma treatment in an ashing machine.

Figure 2:
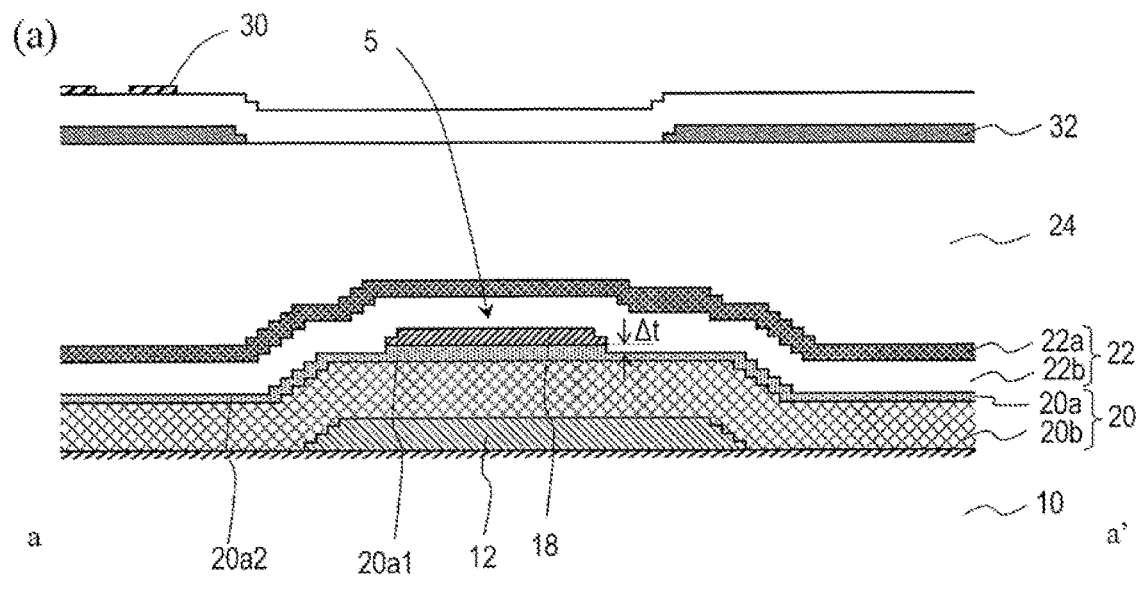
FIG. 2 (a) is a cross-sectional view taken along line a-a' of FIG. 1. (b) is a cross-sectional view taken along line b-b' of FIG. 1.
Figure 2:
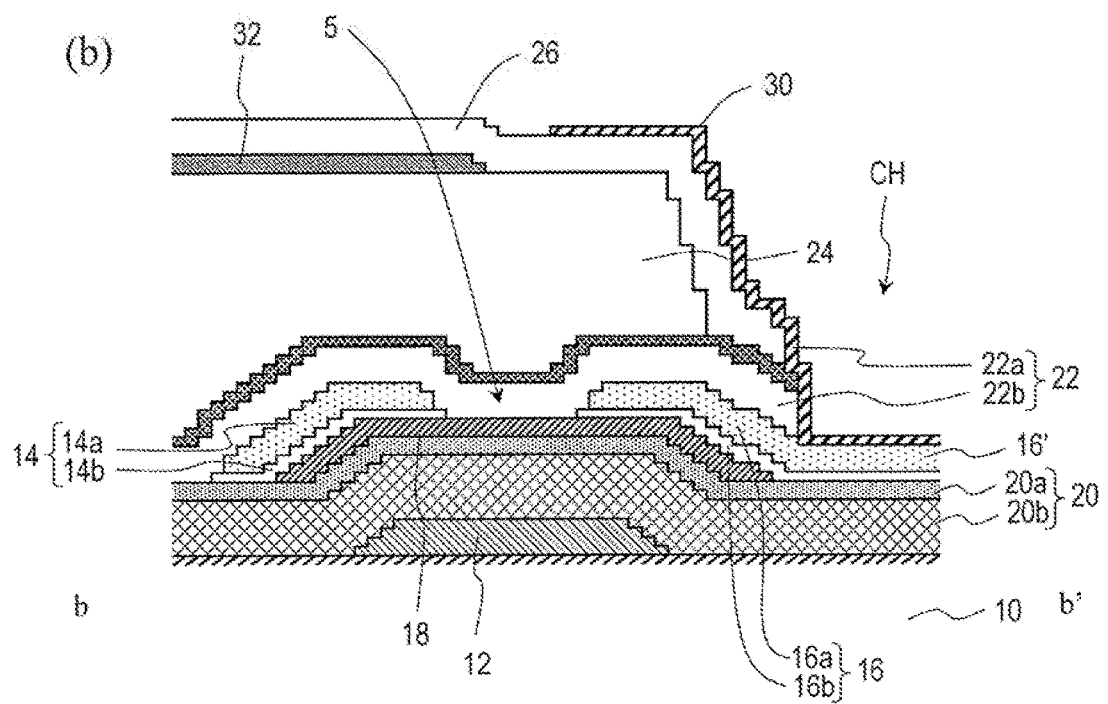

Thereafter, as shown in FIGS. 2(*a*) and 2(*b*), a flattening layer 24 is provided on the protecting layer 22 that covers the oxide semiconductor TFT 5. The flattening layer 24 may be, for example, an organic insulating layer. The flattening layer 24 is obtained by, for example, providing a 1-3 μm thick positive-type photosensitive resin film and forming an opening which corresponds to the contact hole CH.

Thereafter, as shown in FIGS. 2(*a*) and 2(*b*), a common electrode 32 is formed on the flattening layer 24. The common electrode 32 is formed, for example, as follows. The common electrode 32 is obtained by first forming a transparent electrically-conductive film (not shown) by sputtering on the flattening layer 24 and patterning the transparent electrically-conductive film such that an opening is formed in the transparent electrically-conductive film. In the patterning, known photolithography can be used. The opening formed in the transparent electrically-conductive film extends beyond the perimeter of the opening in the flattening layer.

As the transparent electrically-conductive film, for example, an ITO (indium tin oxide) film (thickness: not less than 50 nm and not more than 200 nm), an IZO film, a ZnO film (zinc oxide film), or the like, may be used.

Thereafter, as shown in FIGS. 2(*a*) and 2(*b*), an interlayer insulating layer 26 is provided on the common electrode 32. The interlayer insulating layer 26 may be formed so as to cover the lateral surface of the contact hole CH. The interlayer insulating layer 26 may be obtained by, for example, forming a silicon oxide ($SiO_2$) film, a silicon nitride (SiNx) film, a silicon oxynitride (SiOxNy; x>y) film, a silicon nitroxide (SiNxOy; x>y) film (e.g., 100-400 nm thick), or the like, by CVD.

After the interlayer insulating layer 26 is provided, the protecting layer 22 and the interlayer insulating layer 26 at the bottom of the contact hole CH are etched such that an extended part 16' of the drain electrode is exposed.

Thereafter, a pixel electrode 30 is formed as shown in FIGS. 2(*a*) and 2(*b*). The pixel electrode 30 is obtained by forming a transparent electrically-conductive film (not shown) by, for example, sputtering in the contact hole CH and on the interlayer insulating layer 26 and patterning this transparent electrically-conductive film. The pixel electrode 30 may have a planar shape which has a plurality of slits (or elongated electrode portions) such as shown in FIG. 1 or may have a comb-like planar shape.

As the transparent electrically-conductive film for formation of the pixel electrode 30, for example, an ITO (indium tin oxide) film (thickness: not less than 50 nm and not more than 150 nm), an IZO film, a ZnO film (zinc oxide film), or the like, can be used.

Figure 6:
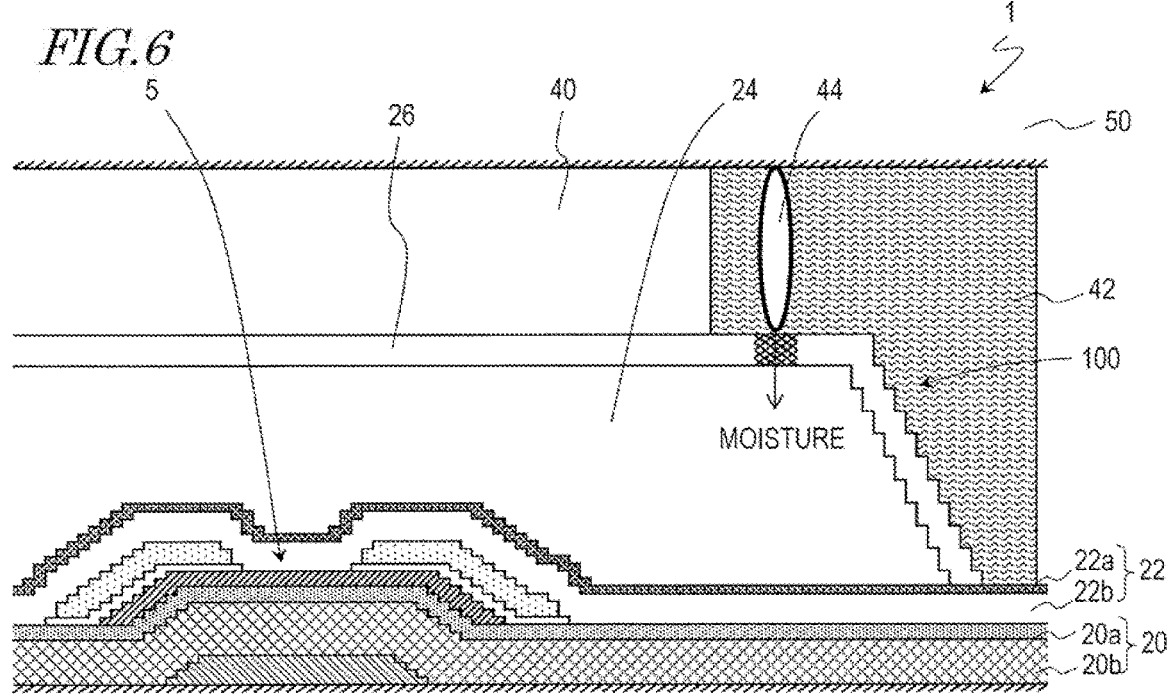
FIG. 6 A cross-sectional view showing a liquid crystal panel manufactured using the active matrix substrate of Embodiment 1.

Through the above-described process, the active matrix substrate 100 is manufactured. Further, as shown in FIG. 6, the active matrix substrate 100 formed as described above can be used to manufacture a liquid crystal panel 1. The liquid crystal panel 1 is manufactured by providing an active matrix substrate 100 and a liquid crystal layer 40 between the active matrix substrate 100 and a counter substrate 50 that opposes the active matrix substrate 100. The liquid crystal layer 40 is enclosed by a sealant 42. In the liquid crystal panel 1 of the present embodiment, a spacer 44 may be provided in the sealant 42.

In the liquid crystal panel 1 shown in FIG. 6, even when a crack is caused by the spacer 44 in the interlayer insulating layer 26 so that moisture enters the flattening layer 24, the protecting layer 22 of excellent coverage can prevent moisture from entering the oxide semiconductor TFT 5. Therefore, depression of the oxide semiconductor TFT 5 can be prevented.

Embodiment 2

Hereinafter, an active matrix substrate (semiconductor device) of Embodiment 2 of the present invention is described. The active matrix substrate 200 of the present embodiment is different from the active matrix substrate 100 of Embodiment 1 in that the active matrix substrate 200 does not include the interlayer insulating layer 26 and the common electrode 32. The other components are the same as those of Embodiment 1 and, therefore, detailed descriptions thereof are herein omitted.

Figure 7:
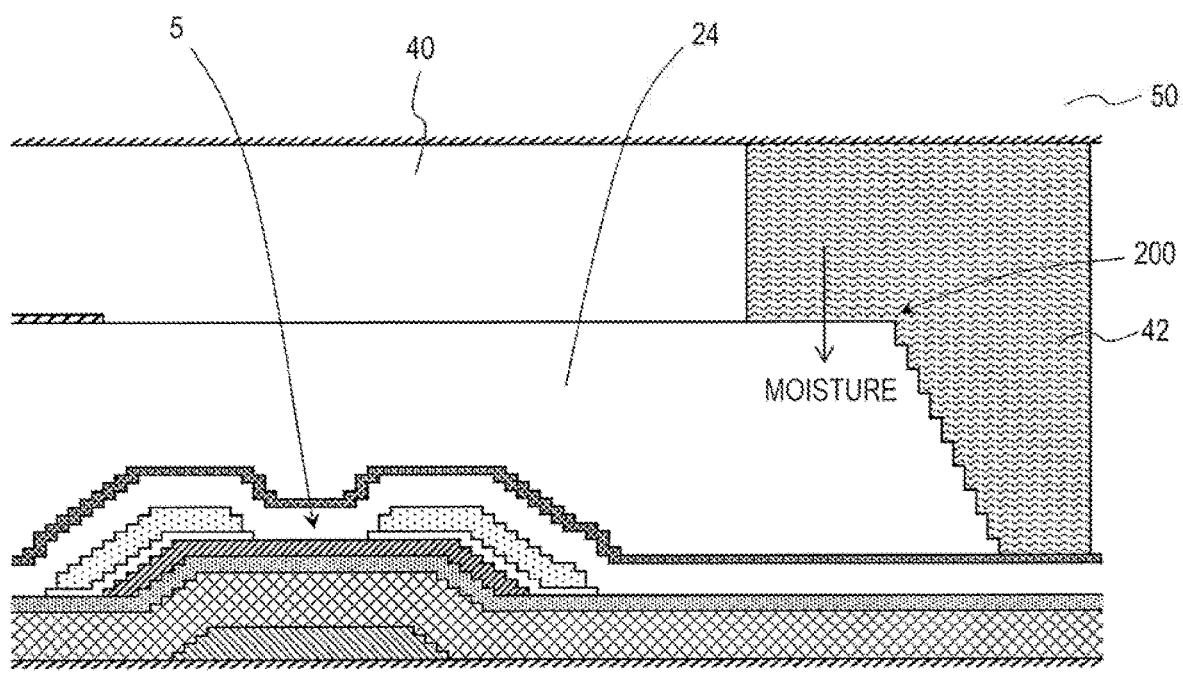
FIG. 7 A cross-sectional view showing a liquid crystal panel manufactured using an active matrix substrate of Embodiment 2.

As shown in FIG. 7, in the present embodiment, the interlayer insulating layer 26 and the common electrode 32 are not provided, and the pixel electrode 30 is provided on the flattening layer 24. In this configuration, moisture enters from the sealant 42 into the flattening layer 24. However, depression of the oxide semiconductor TFT 5 can be prevented because the coverage of the protecting layer 22 is excellent.

The active matrix substrate which does not include the common electrode 32 as previously described may be one for use in a liquid crystal display device which operates in a VA (Vertical Alignment) mode. In this case, the pixel electrode 30 may have a shape extending across the entirety of a rectangular region enclosed by scan lines 2 and signal lines 4. To obtain storage capacitance, a storage capacitance electrode may be provided in the same layer as the scan line 2 such that the storage capacitance electrode opposes the drain electrode 16 via the gate insulating layer 20.

The embodiment shown in FIG. 7 may be one for use in a liquid crystal display device which operates in an IPS (In-Plane-Switching) mode. In this case, both the pixel electrode 30 and the common electrode 32 may be provided on the flattening layer 24. The pixel electrode 30 and the common electrode 32 typically have a comb-like planar shape and are arranged such that comb teeth of the electrodes mesh together.

As shown in FIG. 7, by using a configuration where the lateral surfaces of the flattening layer 24 are covered with the sealant 42, the frame region can be narrowed. In this configuration, also when a driver circuit TFT included in a gate monolithic circuit or the like is provided under the sealant 42, the flattening layer 24 covers the TFT. Therefore, the spacer 44 provided in the seal is prevented from directly breaking the TFT. In the present embodiment, the coverage of the protecting layer 22 is improved such that moisture entering from the outside via the flattening layer 24 is prevented from reaching the oxide semiconductor layer 18. Thus, as previously described, it is possible to use a configuration where the end faces of the flattening layer 24 are covered with the sealant 42.

Embodiment 3

Hereinafter, an active matrix substrate (semiconductor device) 300 of Embodiment 3 of the present invention is described. The active matrix substrate 300 of the present embodiment has the same configuration as Embodiment 1 but is configured not only such that a reversely-tapered portion is not provided in the gate insulating layer 20 but also such that the peripheral portions of the SD layer and the oxide semiconductor layer 18 are configured to have a forwardly-tapered shape, whereby the coverage of the protecting layer 22 is improved.

Figure 8:
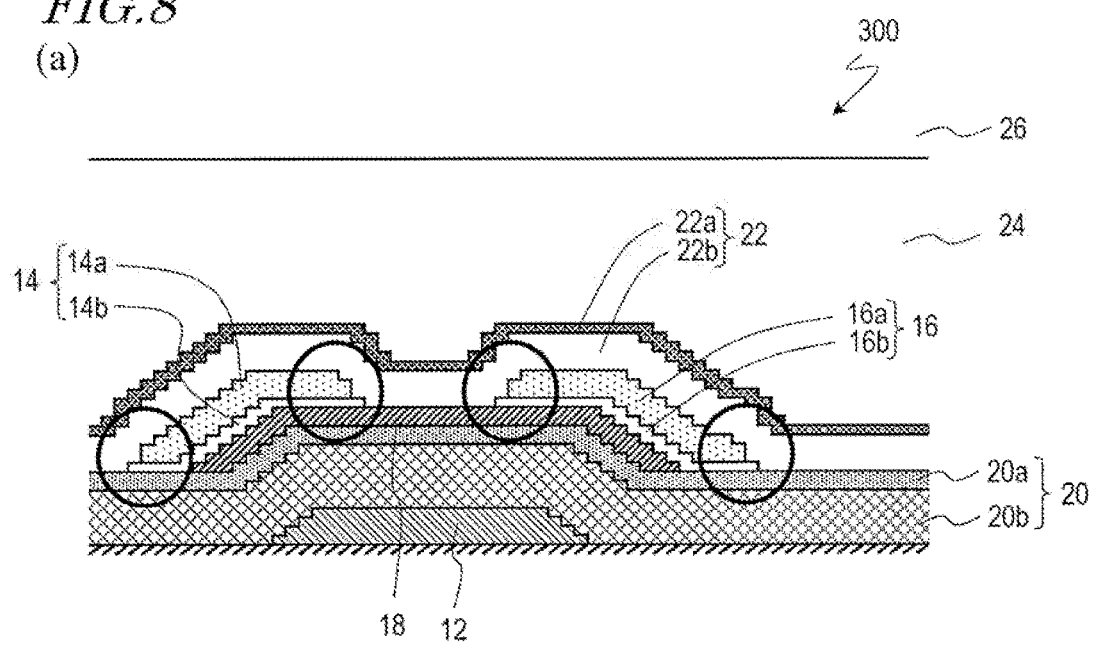
FIG. 8 Cross-sectional views showing an active matrix substrate of Embodiment 3. (a) corresponds to a cross section taken along line b-b' of FIG. 1. (b) corresponds to a cross section taken along line a-a' of FIG. 1. (c) is a cross-sectional view showing examples of "forwardly-tapered", "90°-tapered" and "reversely-tapered" shapes.
Figure 8:
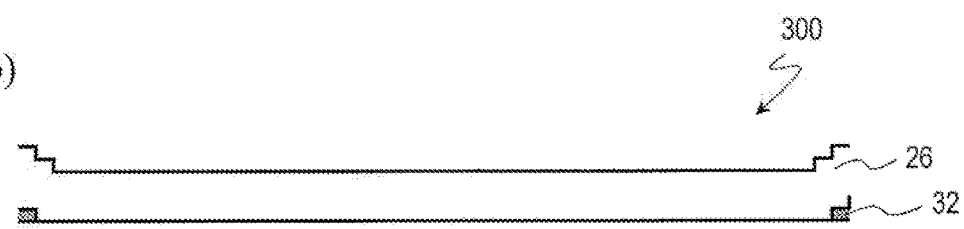
Figure 8:
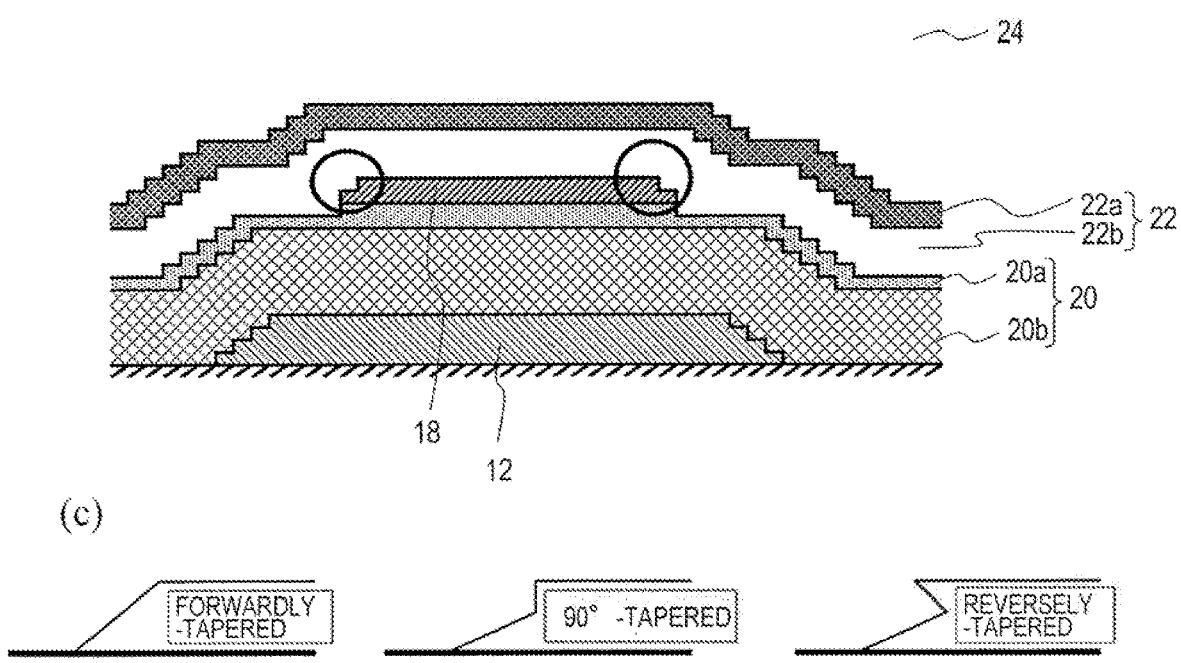

In the present embodiment, the edges of the source electrode 14 and the drain electrode 16 and the edges of the oxide semiconductor layer 18, which are encircled in FIGS. 8(a) and 8(b), have a forwardly-tapered shape. In the oxide semiconductor TFT 5 that is formed by thus stacking up metal layers or insulator layers, the coverage of the protecting layer 22 can be improved by not including a reversely-tapered portion. Note that, as illustrated in FIG. 8(c), the "forwardly-tapered" shape includes a configuration where a surface vertical to the substrate and a slope surface intersect at the lateral surface (90°-tapered shape). Note that, however, the "forwardly-tapered" shape does not include a reversely-tapered configuration which includes slope surfaces cut deeper into the structure than the 90°-tapered shape.

It is known that, to reduce the resistance of wires and electrodes in an active matrix substrate, Cu (copper) or a Cu alloy (e.g., a Cu—Ca based alloy or a Cu—Mg—Al based alloy), which has lower electrical resistivity than Al, is used as source wires and gate wires. Note that, however, there is a probability that Cu is diffused in semiconductor layers so that the device characteristics become unstable. Particularly in a back channel etch type TFT, when Cu or a Cu alloy is used in the SD layer, Cu is likely to diffuse in the oxide semiconductor layer during the source-drain separation step and the $N_2O$ plasma treatment.

In view of the above, if the structure is configured such that the edge of the lower layer electrode is ahead of the edge of the upper layer electrode (i.e., forwardly-tapered shape) as in the present embodiment, diffusion of Cu from the upper layer electrode into the oxide semiconductor layer 18 can be suppressed.

In the active matrix substrate 300 of the present embodiment, the edge of the lower layer electrode (the lower layer source electrode 14b and the lower layer drain electrode 16b) is at a position ahead of the edge of the upper layer electrode (the upper layer source electrode 14a and the upper layer drain electrode 16a) when viewed in a direction perpendicular to the substrate. In other words, the upper layer electrode is provided on the lower layer electrode so as not to cover the peripheral portion of the lower layer electrode. The edge of the lower layer electrode may be ahead of the edge of the upper layer electrode by a distance of, for example, not less than 0.1 μm and not more than 1.0 μm in an in-plane direction. The distance between the edges, Δx, may be not less than 0.2 μm and not more than 0.4 μm.

Such a configuration can be easily realized by, in the SD electrode formation step, patterning an upper layer electrode whose major constituent is Cu by wet etching and thereafter patterning a lower layer electrode whose major constituent is Ti or the like by dry etching.

Although embodiments of the present invention have been described in the foregoing, the present invention may include other various embodiments. For example, although an oxide semiconductor TFT for use as a pixel TFT which is connected with a pixel electrode has been described in the foregoing, the present invention may be applied to a TFT included in a driver which is monolithically provided in an active matrix substrate.

INDUSTRIAL APPLICABILITY

The present invention is widely applicable to an oxide semiconductor TFT and a variety of semiconductor devices which include the oxide semiconductor TFT. For example, the present invention is also applicable to circuit boards such as active matrix substrates and the like, display devices such as liquid crystal display devices, organic electroluminescence (EL) display devices, inorganic electroluminescence display devices and the like, imaging devices such as image sensor devices and the like, and various electronic devices such as image input devices, fingerprint readers, semiconductor memories and the like.

REFERENCE SIGNS LIST 2 scan line
4 signal line
5 oxide semiconductor TFT
10 substrate
12 gate electrode
14 source electrode
16 drain electrode
18 oxide semiconductor layer
20 gate insulating layer
20a upper insulating layer
20b lower insulating layer
20a1 first portion
20a2 second portion
22 protecting layer
24 flattening layer
26 interlayer insulating layer
30 pixel electrode
32 common electrode
40 liquid crystal layer
42 sealant
44 spacer
50 counter substrate
100, 200, 300 active matrix substrate (semiconductor device)
CH contact hole

What is claimed is:

1. A semiconductor device, comprising:
  a substrate;
  a thin film transistor supported by the substrate, the thin film transistor including a gate electrode, an oxide semiconductor layer, a gate insulating layer provided between the gate electrode and the oxide semiconductor layer, and source and drain electrodes electrically connected to the oxide semiconductor layer, the thin film transistor having a channel etch structure; and
  a protecting layer covering an upper surface of the oxide semiconductor layer, an upper surface of the source electrode and an upper surface of the drain electrode, the protecting layer being in direct contact with the upper surface of the oxide semiconductor layer and creating a first horizontal interface between the protecting layer and the oxide semiconductor layer, wherein the gate insulating layer includes a first portion covered with the oxide semiconductor layer and the protecting layer, and a second portion being adjacent to the first portion and being not covered with any of the oxide semiconductor layer, the source electrode and the drain electrode, the gate insulating layer creating a second horizontal interface between the gate insulating layer and the oxide semiconductor layer, the second portion is smaller in thickness than the first portion, and a difference between a thickness of the second portion and a thickness of the first portion is more than 0 nm and not more than 50 nm, wherein the thickness of the first portion is a shortest distance between a topmost surface of the gate electrode and the second horizontal interface, the gate insulating layer includes a lower insulating layer which is in contact with the gate electrode and an upper insulating layer which is provided on the lower insulating layer, and a thickness of the upper insulating layer in the second portion is not zero and is smaller than a thickness of the upper insulating layer in the first portion, wherein the first portion is underneath the first horizontal interface of the protecting layer and the oxide semiconductor layer.

2. The semiconductor device of claim 1, wherein a thickness of the lower insulating layer in the second portion is equal to a thickness of the lower insulating layer in the first portion.

3. The semiconductor device of claim 2, wherein the upper insulating layer is a silicon oxide layer, and the lower insulating layer is a silicon nitride layer.

4. The semiconductor device of claim 2 wherein, in the first portion of the gate insulating layer which is covered with the oxide semiconductor layer, the thickness of the upper insulating layer is not less than 25 nm and not more than 450 nm, and the thickness of the lower insulating layer is not less than 25 nm and not more than 500 nm.

5. The semiconductor device of claim 1,
wherein the protecting layer includes a lower protecting layer which is in contact with an upper surface of the oxide semiconductor layer and an upper protecting layer which is provided on the lower protecting layer, and the lower protecting layer is a silicon oxide layer, and the upper protecting layer is a silicon nitride layer.

6. The semiconductor device of claim 5, wherein a thickness of the upper protecting layer is not less than 25 nm and not more than 150 nm.

7. The semiconductor device of claim 1, wherein
the source and drain electrodes include a lower layer electrode which is in contact with the oxide semiconductor layer and an upper layer electrode provided on the lower layer electrode, the lower layer electrode contains Ti or Mo, and the upper layer electrode contains at least one metal element among Cu, Al and Mo.

8. The semiconductor device of claim 1, wherein the oxide semiconductor layer contains an In—Ga—Zn—O based semiconductor.

9. The semiconductor device of claim 8, wherein the oxide semiconductor layer includes a crystalline portion.

* * * * *